United States Patent
Kim et al.

(10) Patent No.: US 8,257,901 B2
(45) Date of Patent: Sep. 4, 2012

(54) POLYIMIDE-BASED POLYMERS, COPOLYMERS THEREOF AND POSITIVE TYPE PHOTORESIST COMPOSITIONS COMPRISING THE SAME

(75) Inventors: Sang Woo Kim, Daejeon (KR); Chan Hyo Park, Daejeon (KR); Kyung Jun Kim, Deajeon (KR); Hye Ran Seong, Daejeon (KR); Se Jin Shin, Daejeon (KR); Dong Hyun Oh, Daejeon (KR)

(73) Assignee: LG Chem, Ltd., Seoul (KR)

( * ) Notice: Subject to any disclaimer, the term of this patent is extended or adjusted under 35 U.S.C. 154(b) by 221 days.

(21) Appl. No.: 12/720,364

(22) Filed: Mar. 9, 2010

(65) Prior Publication Data

US 2010/0233618 A1    Sep. 16, 2010

(30) Foreign Application Priority Data

Mar. 10, 2009 (KR) .................. 10-2009-0020384
Mar. 9, 2010 (KR) .................. 10-2010-0020703

(51) Int. Cl.
*G03F 7/023* (2006.01)
*C08G 69/32* (2006.01)

(52) U.S. Cl. .............. 430/192; 430/193; 430/270.1; 430/906; 525/436; 528/353

(58) Field of Classification Search .......... 430/270.1, 430/906, 192, 193; 528/353; 525/436
See application file for complete search history.

(56) References Cited

U.S. PATENT DOCUMENTS

| | | | | |
|---|---|---|---|---|
| 3,574,160 A | * | 4/1971 | Hsu | .................. 524/99 |
| 4,985,529 A | * | 1/1991 | Saito et al. | ............ 528/96 |
| 6,875,554 B2 | * | 4/2005 | Hatanaka et al. | ......... 430/270.1 |
| 6,887,534 B2 | * | 5/2005 | Nakata et al. | ............... 428/1.2 |
| 7,026,080 B2 | * | 4/2006 | Nakayama et al. | ............ 430/18 |
| 7,485,405 B2 | * | 2/2009 | Kato et al. | ................ 430/270.1 |
| 7,901,745 B2 | * | 3/2011 | Oh et al. | ..................... 428/1.26 |
| 2003/0194631 A1 | * | 10/2003 | Suwa et al. | ................ 430/151 |
| 2009/0299014 A1 | * | 12/2009 | Oh et al. | ..................... 525/412 |

FOREIGN PATENT DOCUMENTS

| | | |
|---|---|---|
| JP | 2000-063515 | 2/2000 |
| JP | 2002-338686 | 11/2002 |
| KR | 10-2004-0044970 | 5/2004 |
| KR | 10-0851787 | 8/2008 |

OTHER PUBLICATIONS

Nunomura et al. "A new aqueous developable positive tone photodefinable polyimide for a stress buffer coat of semiconductor; HD-8000", Journal of Photopolymer Science and Technology, vol. 14, No. 5 pp. 717-722 (2001).

* cited by examiner

*Primary Examiner* — John Chu
(74) *Attorney, Agent, or Firm* — McKenna Long & Aldridge LLP

(57) ABSTRACT

Polyimide-based polymers and copolymers thereof are provided. Further provided is a positive type photoresist composition comprising at least one of the polyimide-based polymers and copolymers thereof as a binder resin. The photoresist composition exhibits high resolution, high sensitivity, excellent film characteristics and improved mechanical properties, which are required for the formation of semiconductor buffer coatings.

17 Claims, 2 Drawing Sheets

POLYIMIDE-BASED POLYMERS, COPOLYMERS THEREOF AND POSITIVE TYPE PHOTORESIST COMPOSITIONS COMPRISING THE SAME

BACKGROUND OF THE INVENTION

1. Field of the Invention

The present invention relates to polyimide-based polymers containing dianhydride moieties having a particular structure in the repeating units thereof, and/or copolymers of the polyimide-based polymers. The present invention also relates to a positive type photoresist composition comprising at least one of the polyimide-based polymers and/or copolymers thereof as a binder resin to achieve high resolution, high sensitivity, excellent film characteristics and improved physical properties.

The present application claims priority to and the benefit of Korean patent applications No. 10-2009-0020384 and 10-2010-0020703 filed in the Korea Intellectual Property Office on Mar. 10, 2009, and Mar. 9, 2010, respectively, the entire content of which is incorporated hereinto by reference.

2. Description of the Related Art

With the recent trend toward higher integration, higher density, higher reliability and higher speed of electronic devices in the field of semiconductors and semiconductor devices, particularly, liquid crystal display devices, considerable research efforts have been made to utilize the inherent advantages of organic materials that are easy to process and purify. However, organic polymers for use in the field of semiconductors and semiconductor devices should be thermally stable even at temperatures as high as 200° C. in the device fabrication processes.

Polyimide compounds have good thermal stability and excellent mechanical, electrical and chemical properties. These advantages have extended the application of photoresists and photosensitive insulating films including polyimide compounds to the field of semiconductors and displays. Under these circumstances, there is a need for polyimide-based polymer compounds that do not undergo film reduction and swelling in the formation of fine patterns, which have previously not been required in conventional polyimide photoresists.

A polyimide polymer is typically prepared by two-step polycondensation of a diamine and a dianhydride in a polar organic solvent, such as N-methyl-2-pyrrolidone (NMP), dimethylacetamide (DMAc) or dimethylformamide (DMF) to obtain a polyimide precursor solution, coating the polyimide precursor solution on a silicon wafer or glass, and curing the coating by baking. Commercially available polyimide products for electronic materials are supplied in the form of polyimide precursor solutions or polyimide films. Polyimide precursor solutions are main forms of polyimide products supplied in the field of semiconductor devices.

Polyimide resins are applied to the production of buffer coating films of semiconductor devices. In a large-scale integrated (LSI) circuit, volume shrinkage of a resin after packaging and thermal stress arising from the difference in the coefficient of thermal expansion between a chip and the resin induce cracks in a passivation film of the chip and damage to metal interconnections. In an effort to solve such problems, a buffer layer composed of a polyimide is formed between the chip and the packaging material. The buffer layer should be as thick as 10 µm to perform its role. The thicker the buffer layer, the better the buffering effect, leading to an improvement in the yield of semiconductor products.

A polyimide layer requires the formation of fine patterns, such as electrode interconnections and wire bonding pads. Via holes are formed in the polyimide layer by coating a photoresist on a conventional non-photosensitive polyimide film, followed by etching. In recent years, many attempts have been made to apply photosensitive polyimides to the formation of via holes. The use of a conventional non-photosensitive polyimide requires etching for processing holes through a photoresist to bond wires and connect metal interconnections, whereas the use of a photosensitive polyimide can eliminate the need for lithography using a photoresist. In the latter case, the buffer coating process is shortened by about 50%, resulting in productivity improvement and cost reduction. The final step of the semiconductor device fabrication process is also shortened, greatly contributing to an improvement in production yield.

Research is being actively undertaken on positive type photosensitive polyimides rather than on negative type photosensitive polyimides for the following reasons.

The first reason is that a positive type photosensitive polyimide has a higher resolution than a negative type photosensitive polyimide. The second reason is that a positive type photosensitive polyimide is exposed in a relatively small area, compared to a negative type photosensitive polyimide, indicating low possibility of defects. The third reason is that the use of a negative type photosensitive polyimide causes problems in terms of production cost and environmental pollution (e.g., waste water treatment) because it requires an organic solvent such as N-methyl-2-pyrrolidone (NMP) or dimethylacetamide (DMAc) as a developer, while the use of a positive type photosensitive polyimide is economically advantageous and environmentally friendly because it requires an alkaline aqueous solution as a developer.

Many methods have been developed to impart polyimide resins with photosensitivity, for example, by chemically bonding cross-linkable functional groups to the polyimide precursors or mixing cross-linkable monomers with the polyimide precursors, in order to use the polyimide resins for the preparation of photoresist compositions.

As another example, a quinonediazide compound is added to a polyamic acid, a polyamic ester having acid functional groups in the side chains thereof or a polyimide having acid functional groups in the side chains thereof. However, high solubility of the polyamic acid in an alkaline developer causes the problem of film reduction upon development, which requires the addition of an amine, etc. Further, the polyimide or the polyamic ester has high resolution, but the acid functional groups remain even after curing, causing the problems of high water absorption or poor alkali resistance of the cured film.

Thus, there is an urgent need in the art to develop high-resolution polyimide compounds that do not suffer from film reduction or swelling during fine pattern formation while possessing appropriate solubility in alkaline developers.

SUMMARY OF THE INVENTION

The present inventors have found that the problems of the prior art can be solved by the use of at least one of polyimide-based polymers, such as polyimide polymers, polyamic acid polymers and polyamic ester polymers, containing dianhydride moieties having a particular structure in the repeating units thereof, and/or copolymers thereof as a binder resin in the preparation of a photoresist composition. The present invention has been accomplished based on this finding.

An object of the present invention is to provide photosensitive polyimide-based polymers and/or copolymers thereof, at least one of which is added as a binder resin to prepare a photoresist composition having high resolution, high sensitivity, excellent film characteristics and improved mechanical properties while possessing appropriate solubility in an alkaline developer.

Another object of the present invention is to provide a positive type photoresist composition comprising at least one of the polyimide-based polymers and/or copolymers thereof as a binder resin.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
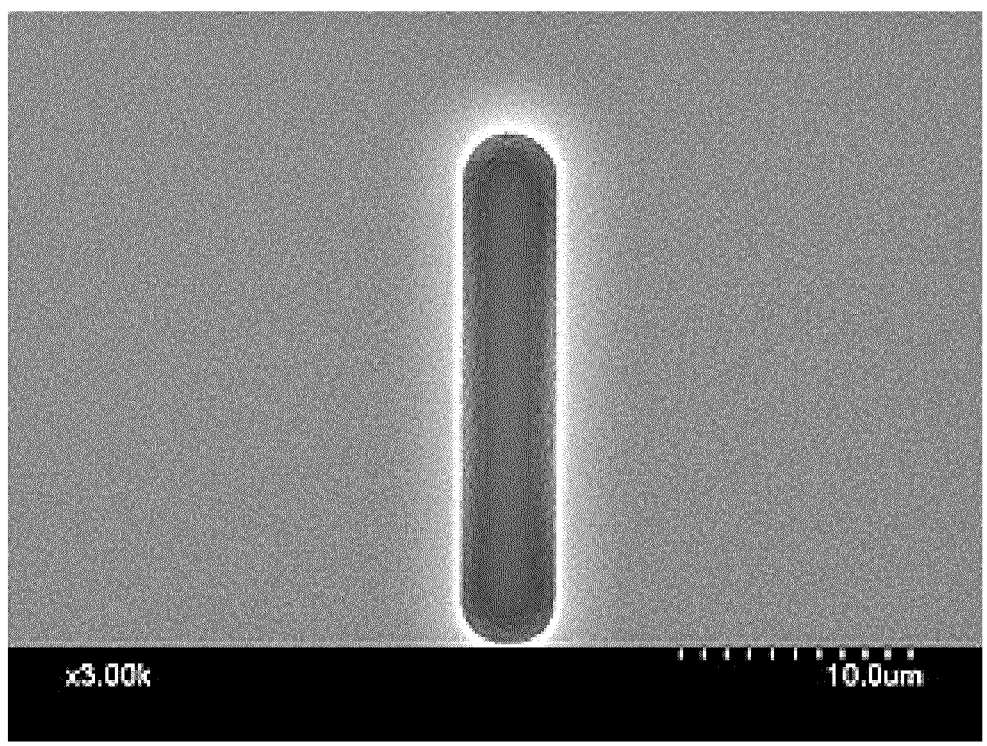
FIGS. 1 and 2 are electron microscope images of patterns formed using compositions prepared in Examples 5 and 6, respectively.

Exemplary embodiments of the present invention will now be described in detail.

The present invention provides a photosensitive polyimide-based polymer or a copolymer thereof.

1. Polyimide-Based Polymer and Copolymer Thereof

The photosensitive polyimide-based polymer and/or copolymer of the present invention may be at least one compound selected from the group consisting of polyimide polymer, a polyamic acid and a polyamic ester.

The polyimide-based polymer and/or copolymer of the present invention is a compound represented by Formula 1:

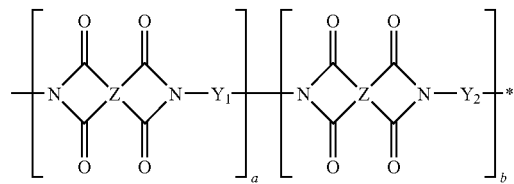

wherein each Z is a tetravalent organic group derived from one or more tetracarboxylic acids, including 3,4-dicarboxy-1,2,3,4-tetrahydro-6-tert-butyl-1-naphthalene succinic dianhydride (DTBDA), or derivatives thereof, a is from 1 to 150, b is from 1 to 400, $Y_1$ is a divalent organic group derived from a diamine and is selected from

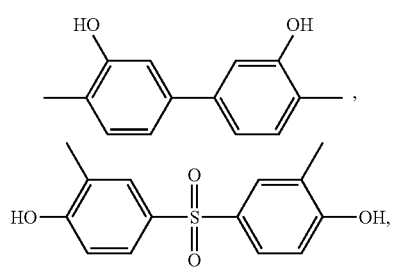

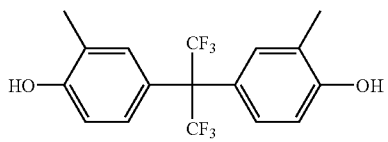

and

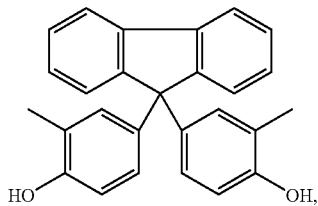

and $Y_2$ is a divalent aliphatic group or aromatic organic group derived from a diamine.

The compound of Formula 1 is a polyimide copolymer containing the repeating units a and b. The compound of Formula 1 is prepared by reacting one or more organic tetracarboxylic acids or derivatives thereof containing the moiety Z with an organic diamine containing the moiety $Y_1$. In a particular embodiment, the compound of Formula 1 is prepared by polymerizing one or more tetracarboxylic dianhydrides (commonly called "acid anhydrides") with an organic diamine (commonly called a "diamine") to obtain a polyimide precursor, followed by dehydration ring closure.

When it is intended to use the polyimide-based compound of the present invention as a binder resin for the preparation of a photoresist composition, it should have appropriate solubility in an alkaline developer. 3,4-dicarboxy-1,2,3,4-tetrahydro-6-tert-butyl-1-naphthalene succinic dianhydride (DTBDA) containing the moiety Z is preferably used in an amount of 1 to 100 mole %, based on the total moles of the acid anhydrides used.

Examples of the acid anhydrides other than DTBDA include aliphatic, aromatic and alicyclic dianhydrides, such as pyromellitic anhydride, 3,3',4,4'-biphenyltetracarboxylic dianhydride, 3,3',4,4'-benzophenonetetracarboxylic dianhydride, 3,3',4,4'-diphenyl ether tetracarboxylic dianhydride, 3,3',4,4'-diphenylsulfone tetracarboxylic dianhydride, 2,2-bis(3,4-dicarboxyphenyl)hexafluoroisopropylidene dianhydride, 4,4'-hexafluoroisopropylidene diphthalic anhydride, 3,3',4,4'-diphenylsulfone tetracarboxylic dianhydride, 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane acetic dianhydride, bicyclo[2.2.2]oct-7-ene-2,3,5,6-tetracarboxylic dianhydride, 2,3,4,5-tetrahydrofurantetracarboxylic dianhydride, 3,5,6-tricarboxy-2-norbornane acetic dianhydride, and 1,2,3,4-butanetetracarboxylic dianhydride.

Each of $Y_1$ and $Y_2$ in Formula 1 is a divalent aliphatic or aromatic organic group derived from a diamine. Preferably, $Y_1$ is a substituent selected from

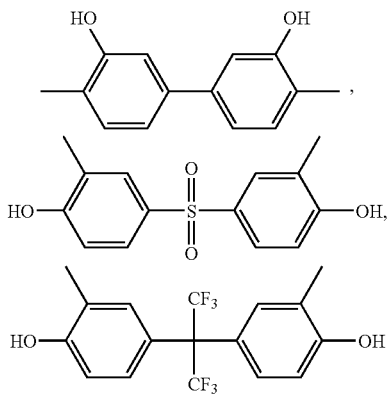

and

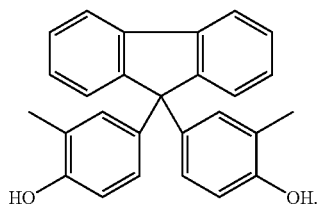

$Y_2$ may be any of divalent aliphatic or aromatic organic groups derived from diamines used for the preparation of common polyimide-based compounds. Specific examples of such diamines include: aromatic diamines, such as p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis (2-methylaniline), 4,4'-methylene-bis(2,6-dimethylaniline), 4,4'-methylene-bis(2,6-diethylaniline), 4,4'-methylene-bis (2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy) phenyl]sulfone, 2,2-bis[4-(4-aminophenoxy)phenyl] propane, and 2,2-bis[4-(3-aminophenoxy)phenyl]propane;

aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diaminobenzanilide, 2,2-bis-[4-(4-aminophenoxy)phenyl]hexafluoropropane, 1,3-bis (3-aminopropyl)tetramethyldisiloxane, bis(p-aminophenoxy)dimethylsilane, diaminohexane, diaminododecane, 1,3-bis(4-aminophenoxy)benzene, 2,2-bis[4-(4-aminophenoxy)phenyl]propane, 1,1-bis(4-aminophenoxyphenyl)cyclohexane, bis[4-(4-aminophenoxy) phenyl]sulfone, 1,3-bis(3-aminophenoxy)benzene, 5-amino-1,3,3-trimethylcyclohexanemethylamine, 4,4'-bis(4-aminophenoxy)biphenyl, 1,1-bis(4-aminophenyl) cyclohexane, α,α'-bis(4-aminophenyl)-1,4-diisopropylbenzene, 1,3-bis(4-aminophenoxy)-2,2-dimethylpropane, 1,3-bis(4-aminophenoxy)benzene, 9,9-bis (4-aminophenyl)fluorine, and 4,4'-diamino-3,3'-dimethyldicyclohexylmethane; and mixtures thereof.

The acid anhydrides may be reacted with the diamine at a temperature of 80 to 240° C. and preferably 130 to 200° C.

The reaction is carried out in a polar solvent selected from N,N-dimethylformamide, N,N-dimethylacetamide, N-methylpyrrolidone, N-vinylpyrrolidone, N-methylcaprolactam, dimethylsulfoxide, tetramethylurea, pyridine, dimethylsulfone, hexamethylsulfoxide, m-cresol, γ-butyrolactone, and mixtures thereof.

The reaction may give a polyamic acid as a polyimide precursor. In this case, the polyamic acid is collected and separated in the form of a precipitate in a suitable solvent such as methanol or ethanol. Alternatively, the polyimide may be directly prepared.

The compound represented by Formula 1 preferably has a weight average molecular weight of 1,000 to 100,000 and a glass transition temperature of 200 to 400° C.

The polyamic acid of the present invention is a compound represented by Formula 2:

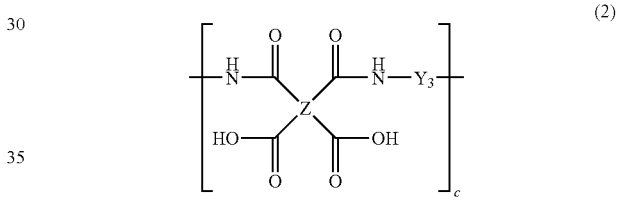

(2)

The compound represented by Formula 2 can be prepared by reacting one or more organic tetracarboxylic dianhydrides containing the moiety Z with an organic diamine containing the moiety $Y_3$.

In Formula 2, Z is a tetravalent organic group derived from one or more tetracarboxylic acids, including 3,4-dicarboxy-1,2,3,4-tetrahydro-6-tert-butyl-1-naphthalene succinic dianhydride (DTBDA), or derivatives thereof. Examples of the acid anhydrides other than DTBDA are as defined in Formula 1. $Y_3$ is selected from $Y_1$ and $Y_2$ defined in Formula 1 and combinations thereof, and c is 5 to 200. DTBDA is preferably included in an amount of 1 to 100 mole %.

The reaction of the acid anhydrides and the diamine for the preparation of the polyamic acid is carried out at a temperature of −20 to 150° C., preferably −5 to 100° C., in a polar solvent selected from N,N-dimethylformamide, N,N-dimethylacetamide, N-methylpyrrolidone, N-vinylpyrrolidone, N-methylcaprolactam, dimethylsulfoxide, tetramethylurea, pyridine, dimethylsulfone, hexamethylsulfoxide, m-cresol, γ-butyrolactone and mixtures thereof.

c representing the number of the repeating units of the polyamic acid represented by Formula 2 is preferably from 5 to 200.

The compound represented by Formula 2 preferably has a weight average molecular weight of 1,000 to 200,000 and a glass transition temperature of 100 to 300° C.

The polyamic ester of the present invention is a compound represented by Formula 3:

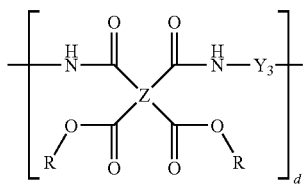

(3)

The compound represented by Formula 3 can be prepared by reacting one or more organic tetracarboxylic dianhydrides containing the moiety Z with an organic diamine containing the moiety $Y_3$.

In Formula 3, Z is a tetravalent organic group derived from one or more tetracarboxylic acids, including 3,4-dicarboxy-1,2,3,4-tetrahydro-6-tert-butyl-1-naphthalene succinic dianhydride (DTBDA), or derivatives thereof. Examples of the acid anhydrides other than DTBDA are as defined in Formula 1. $Y_3$ is selected from $Y_1$ and $Y_2$ defined in Formula 1 and combinations thereof, R is selected from the group consisting of alkyl and silyl alkyl groups, and d is 5 to 200. DTBDA is preferably included in an amount of 1 to 100 mole %.

The reaction of the acid anhydrides and the diamine for the preparation of the polyamic ester is carried out at a temperature of −20 to 150° C., preferably −5 to 100° C., in a polar solvent selected from N,N-dimethylformamide, N,N-dimethylacetamide, N-methylpyrrolidone, N-vinyl pyrrolidone, N-methylcaprolactam, dimethylsulfoxide, tetramethylurea, pyridine, dimethylsulfone, hexamethylsulfoxide, m-cresol, γ-butyrolactone and mixtures thereof.

d representing the number of the repeating units of the polyamic ester represented by Formula 3 is preferably from 5 to 200.

The compound represented by Formula 3 preferably has a weight average molecular weight of 1,000 to 200,000 and a glass transition temperature of 100 to 300° C.

The polyimide-based polymers and/or copolymers of Formulas 1 to 3 preferably have a transmittance for i-line of 50% or higher. This high i-line transmittance increases the transmittance of wavelengths at which the photoreaction of a photoactive compound (PAC) for i-line occurs, and as a result, the photoactive compound has high reaction efficiency, resulting in higher sensitivity and resolution.

In a preferred embodiment, the polyimide copolymer of Formula 1, the polyamic acid of Formula 2 and the polyamic ester of Formula 3 are represented by Formulas 4, 5 and 6, respectively:

wherein $Y_4$ and $Y_5$ are as defined as $Y_1$ and $Y_2$ in Formula 1, respectively, and e and f representing the numbers of the repeating units are from 1 to 150 and from 1 to 400, respectively,

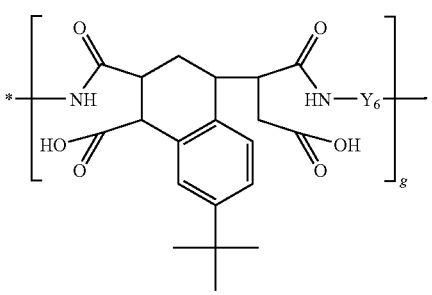

(5)

wherein $Y_6$ is as defined as $Y_3$ in Formula 2, g representing the number of the repeating units is from 5 to 200, and

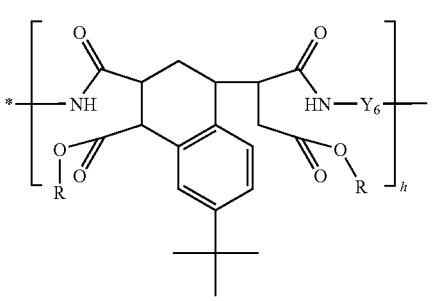

(6)

wherein $Y_6$ is as defined as $Y_3$ and h representing the number of the repeating units is from 5 to 200.

The photosensitive polyimide-based copolymer of the present invention is prepared by copolymerizing at least one of the compounds of Formulas 1 to 3. That is, the polyimide-based copolymer of the present invention may be a copolymer of the polyimide copolymer of Formula 1 and the polyamic acid of Formula 2, a copolymer of the polyimide copolymer of Formula 1 and the polyamic ester of Formula 3, or a copolymer of the polyamic acid of Formula 2 and the polyamic ester of Formula 3.

The copolymer of the polyimide copolymer of Formula 1 and the polyamic acid of Formula 2 can be prepared through partial imidization of the polyamic acid. The copolymer of the polyimide copolymer of Formula 1 and the polyamic ester of Formula 3 can be prepared through partial imidization of

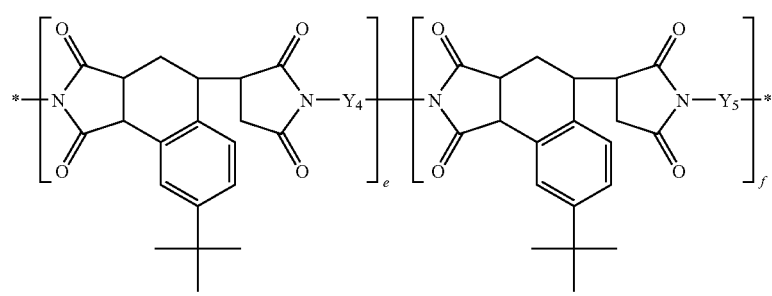

(4)

the polyamic ester. The copolymer of the polyamic acid of Formula 2 and the polyamic ester of Formula 3 can be prepared through partial esterification of the polyamic acid.

2. Positive Type Photoresist Composition

The present invention also provides a positive type photoresist composition, comprising:

100 parts by weight of at least one polyimide-based polymers selected from the group consisting of Formulas 1 to 3 and/or copolymers thereof, or a blend of 1 to 99 parts by weight of at least one polyimide-based polymers selected from the group consisting of Formulas 1 to 3 and/or copolymers thereof and 1 to 70 parts by weight of a polyamic acid of Formula 7:

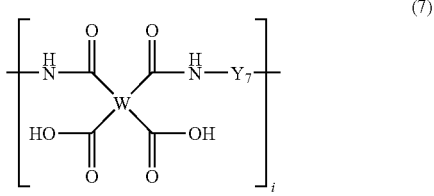

wherein W is a tetravalent organic group derived from a tetracarboxylic acid or a derivative thereof and contains (preferably 1 to 100 mole % of) at least one moiety selected from the group consisting of

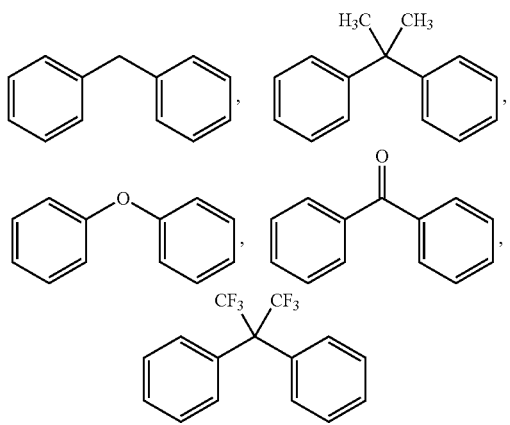

and

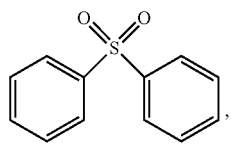

$Y_7$ is a divalent organic group derived from a diamine and i is from 5 to 200, as a binder resin;
    a photoactive compound; and
    a solvent.

Specifically, the positive type photoresist composition of the present invention comprises: 100 parts by weight of at least one photosensitive polyimide-based polymers selected from the group consisting of Formulas 4 to 6 and/or copolymers thereof, or a blend of 1 to 99 parts by weight of at least one photosensitive polyimide-based polymer selected from the group consisting of Formulas 4 to 6 and/or copolymers thereof and 1 to 70 parts by weight of the polyamic acid of Formula 7 as a binder resin: a photoactive compound; and a solvent.

That is, the binder resin may be at least one of the polyimide-based polymers and/or copolymers thereof selected from the group consisting of Formulas 1 to 6; or a blend of at least one of the polyimide-based polymers and/or copolymers thereof and the polyamic acid of Formula 7.

The polyamic acid of Formula 7 can be prepared by reacting an organic tetracarboxylic dianhydride containing the moiety W with an organic diamine containing the moiety $Y_3$.

The tetracarboxylic dianhydride containing the moiety W is selected from the group consisting of pyromellitic anhydride, 3,3',4,4'-biphenyltetracarboxylic dianhydride, 3,3',4,4'-benzophenonetetracarboxylic dianhydride, 3,3',4,4'-diphenyl ether tetracarboxylic dianhydride, 3,3',4,4'-diphenylsulfone tetracarboxylic dianhydride, 2,2-bis(3,4-dicarboxyphenyl)hexafluoroisopropylidene dianhydride, 4,4'-hexafluoroisopropylidene diphthalic anhydride, 3,3',4,4'-diphenylsulfone tetracarboxylic dianhydride, 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,4,5-cyclohexanetetracarboxylic dianhydride, 3,4-dicarboxy-1,2,3,4-tetrahydro-1-naphthalene succinic dianhydride, 5-(2,5-dioxotetrahydrofuryl)-3-methyl-3-cyclohexene-1,2-dicarboxylic dianhydride, 2,3,5-tricarboxy-2-cyclopentane acetic dianhydride, bicyclo[2.2.2]oct-7-ene-2,3,5,6-tetracarboxylic dianhydride, 2,3,4,5-tetrahydrofurantetracarboxylic dianhydride, 3,5,6-tricarboxy-2-norbornane acetic dianhydride, and 1,2,3,4-butanetetracarboxylic dianhydride.

$Y_7$ may be any of divalent aliphatic or aromatic organic groups derived from diamines. Specifically, Specific examples of such diamines include: aromatic diamines, such as p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane; aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, and 4,4'-diaminobenzanilide; and mixtures thereof.

The reaction of the acid anhydride and the diamine for the preparation of the polyamic acid is carried out at a temperature of −20 to 150° C., preferably −5 to 100° C., in a polar solvent selected from N,N-dimethylformamide, N,N-dimethylacetamide, N-methylpyrrolidone, N-vinylpyrrolidone, N-methylcaprolactam, dimethylsulfoxide, tetramethylurea, pyridine, dimethylsulfone, hexamethylsulfoxide, m-cresol, γ-butyrolactone and mixtures thereof.

i representing the number of the repeating units of the polyamic acid represented by Formula 7 is preferably from 5 to 200.

The polyamic acid represented by Formula 7 preferably has an elongation as high as 40%. The polyamic acid represented by Formula 7 serves to protect a semiconductor device from deformation and damage when thermal or mechanical stress is applied to the semiconductor device and to improve the reliability of the semiconductor device due to its high elongation.

As mentioned above, the polyimide-based polymers of Formulas 1 to 6 and/or copolymers thereof as used binder resin preferably have a transmittance for i-line of 50% or higher. This high i-line transmittance increases the transmittance of wavelengths at which the photoreaction of the photoactive compound (PAC) for i-line occurs, and as a result, the photoactive compound has high reaction efficiency, resulting in higher sensitivity and resolution.

The photoactive compound refers to a compound that can generate an acid when irradiated with light. The photoactive compound is not particularly limited so long as it generates an acid by photoreaction to increase the solubility of an exposed portion in an alkaline developer. Specifically, the photoactive compound is preferably an o-quinonediazide compound, an allyl diazonium salt, a diallyl iodonium salt, a triallyl sulfonium salt, an o-nitrobenzyl ester, a p-nitrobenzyl ester, a trihalomethyl group-substituted s-triazine derivative, or an imidosulfonate derivative. An o-quinonediazide compound is preferred in terms of sensitivity or resolution. The o-quinonediazide compound is commonly an o-quinonediazidesulfonic acid ester or an o-quinonediazidesulfone amide obtained by condensation of an o-quinonediazide sulfonyl chloride and a compound having at least one hydroxyl group or at least one amino group in the presence of a base catalyst.

The o-quinonediazide sulfonyl chloride can be prepared from an o-quinonediazide sulfonic acid, for example, 1,2-naphthoquinone-2-diazide-4-sulfonic acid, 1,2-naphthoquinone-2-diazide-5-sulfonic acid or 1,2-naphthoquinone-2-diazide-6-sulfonic acid.

Particularly preferred is an o-quinonediazide sulfonic acid is at least one compound selected from following Formulas 8 to 11:

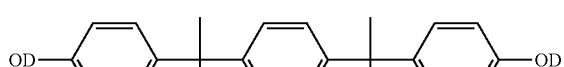

(8)

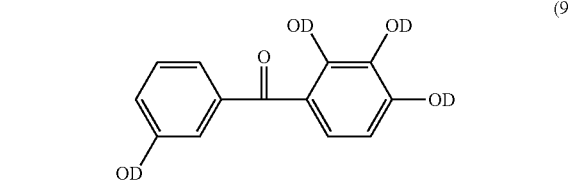

(9)

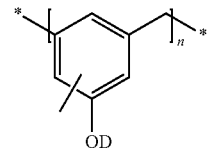

(10)

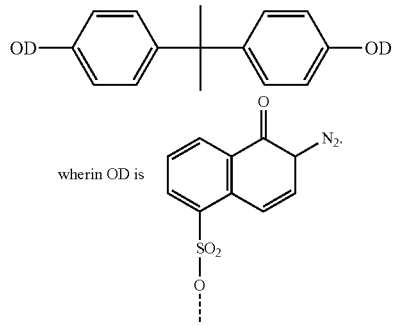

(11)

wherin OD is

The photoactive compound is preferably present in an amount of 1 to 50 parts by weight, based on 100 parts by weight of the polyimide-based binder resin.

If needed, the photoresist composition of the present invention may further comprise at least one sensitizer selected from perylene, anthracene, thioxanthone, Michler's ketone, benzophenone and fluorene.

The solvent may be any of those capable of dissolving the polyimide-based polymer. For example, the solvent is selected from the group consisting of N,N-dimethylformamide, N,N-dimethylacetamide, N-methylpyrrolidone, N-vinylpyrrolidone, N-methylcaprolactam, dimethylsulfoxide, tetramethylurea, pyridine, dimethylsulfone, hexamethylsulfoxide, m-cresol, γ-butyrolactone, ethyl cellosolve, butyl cellosolve, ethyl carbitol, butyl carbitol, ethyl carbitol acetate, butyl carbitol acetate, ethylene glycol, ethyl lactate, butyl lactate, cyclohexanone, cyclopentanone, and mixtures thereof. The solvent is preferably present in an amount of 30 to 90 parts by weight, based on 100 parts by weight of the polyimide-based binder resin.

The photoresist composition of the present invention may further comprise one or more additives selected from dissolution rate modifiers, sensitizers, adhesion promoters and surfactants.

The photoresist composition of the present invention is applied to a substrate, such as glass, by a suitable coating process, such as spin coating, slit spin coating, roll coating, die coating or curtain coating, followed by exposure and development to form a pattern. The exposure and development are performed by suitable processes known in the art.

Light used for the exposure process is not particularly limited. For example, electromagnetic radiation, visible light, UV light, electron beam, X ray or laser can be used to irradiate the photoresist composition.

Examples of light sources suitable for use in the exposure process include, but are not especially limited to, high-pressure mercury lamps, xenon lamps, carbon arc lamps, halogen lamps, cold-cathode tubes for copiers, LEDs and semiconductor lasers.

Thereafter, the exposed photoresist layer is developed with a developer to remove the unexposed region, leaving a desired pattern.

The developer is not particularly limited. As the developer, there can be exemplified an aqueous solution of an alkali metal or alkaline earth metal hydroxide or carbonate, a hydrogen carbonate, ammonia water or a quaternary ammonium salt. An alkaline aqueous solution of KOH is particularly preferred.

The developer may contain a surfactant, a defoaming agent, an organic base (e.g., benzylamine, ethylenediamine, ethanolamine, tetramethylammonium hydroxide, diethylenetriamine, triethylenepentamine, morpholine or triethanolamine), an organic solvent as a development promoter (e.g., an alcohol, a ketone, an ester, an ether, an amide or a lactone), etc. The developer may be water, an organic solvent, or a mixture of an alkaline aqueous solution and an organic solvent.

The overall procedure for the formation of a pattern is as follows. First, the photoresist composition is spin-coated on a substrate. The coated substrate is prebaked at about 100° C. for 2 min to form a film. The film is exposed under a high-pressure mercury lamp with an exposure energy of 100-200 mJ/cm$^2$ through a photomask. The exposed film is developed with an alkaline aqueous solution of KOH, washed with deionized water, and post-baked at 200° C. for about 40 min to form a pattern.

The thickness of the photoresist layer may vary depending on the intended purpose. The thickness of the photoresist layer is preferably in the range of 1 to 20 μm, but it is not limited to this range.

The photoresist composition of the present invention exhibits positive type photosensitivity of high sensitivity and high resolution. In addition, the photoresist composition of the present invention is easy to etch with an alkaline aqueous solution. Furthermore, exposure of the photoresist composition through a mask having a predetermined pattern facilitates the formation of a polyimide resin film having a fine shape and a relief pattern with high dimensional precision.

The positive type photoresist composition of the present invention is suitable for the formation of an interlayer insulating film, a passivation film, a buffer coating film or an insulating film for a multilayer printed board of a semiconductor device. The positive type photoresist composition of the present invention is also suitable for the formation of an insulating film of an OLED, a protective film of a thin film transistor of a liquid crystal display device. The positive type photoresist composition of the present invention is also suitable for the formation of an electrode protective film or a semiconductor protective film of an organic EL device.

Hereinafter, the present invention will be explained in more detail with reference to the following examples. However, these examples are not intended to limit the scope of the invention.

EXAMPLES

Example 1

Preparation of Polyimide Copolymer of Formula 1

11.0 g of 2,2-bis(3-amino-4-hydroxyphenyl)hexafluoropropane and 40 g of γ-butyrolactone were sequentially placed in a 100 mL round-bottom flask. The mixture was completely dissolved with slow stirring. 10.7 g of 3,4-dicarboxy-1,2,3,4-tetrahydro-6-tert-butyl-1-naphthalene succinic dianhydride (DTBDA) was slowly added to the flask in a water bath while maintaining the flask at room temperature. The resulting mixture was stirred at room temperature for 16 hr, and then 7 g of toluene was added thereto. After a Dean-Stark distillation trap was installed in the flask, the mixture was heated to reflux at 140° C. for 3 hr in to remove water. The solution was cooled to room temperature and was slowly poured into a methanol/water (1/4) solution. The obtained solid was dried in a vacuum drying oven at 40° C. for one day, yielding 16 g of a soluble polyimide resin.

IR peaks corresponding to the polyimide were observed. The polyimide resin was found to have a weight average molecular weight of 40,000, as measured by GPC, and a polydispersity index (PDI) of 1.6.

Example 2

Preparation of Polyamic Acid of Formula 2

6 g of 4,4'-oxydianiline and 40 g of γ-butyrolactone were sequentially placed in a 100 mL jacketed round-bottom flask. The mixture was completely dissolved with slow stirring. 10.7 g of 3,4-dicarboxy-1,2,3,4-tetrahydro-6-tert-butyl-1-naphthalene succinic dianhydride (DTBDA) was slowly added to the flask with stirring while maintaining the jacket temperature of the reactor at 20° C. The resulting mixture was sufficiently reacted with stirring for 2 hr. Stirring was continued at room temperature for 16 hr, yielding a polyamic acid.

IR peaks corresponding to the polyamic acid were observed. The polyamic acid was found to have a weight average molecular weight of 50,000, as measured by GPC, and a polydispersity index (PDI) of 1.6.

Example 3

Preparation of Polyamic Ester of Formula 3

7.5 g of N,N'-bistrimethylsilylbenzene-1,4-diamine and 40 g of γ-butyrolactone were sequentially placed in a 100 mL jacketed round-bottom flask. The mixture was completely dissolved with slow stirring. 10.7 g of 3,4-dicarboxy-1,2,3,4-tetrahydro-6-tert-butyl-1-naphthalene succinic dianhydride (DTBDA) was slowly added to the flask with stirring while maintaining the jacket temperature of the reactor at 20° C. The resulting mixture was sufficiently reacted with stirring for 2 hr. Stirring was continued at room temperature for 20 hr, yielding a polyamic ester.

IR peaks corresponding to the silyl ester were observed. The polyamic ester was found to have a weight average molecular weight of 40,000, as measured by GPC, and a polydispersity index (PDI) of 1.5.

Example 4

Preparation of Polyamic Acid of Formula 7

73.3 g of 4,4'-oxydianiline and 300 g of γ-butyrolactone were sequentially placed in a 1 L jacketed round-bottom flask. The mixture was completely dissolved with slow stirring. 55.8 g of 3,3',4,4'-diphenylsulfone tetracarboxylic dianhydride was slowly added to the flask with stirring while maintaining the jacket temperature of the reactor at 20° C. The resulting mixture was sufficiently reacted with stirring for 2 hr. Stirring was continued at room temperature for 16 hr, yielding a polyamic acid.

IR peaks corresponding to the polyamic acid were observed. The polyamic acid was found to have a weight average molecular weight of 50,000, as measured by GPC, and a polydispersity index (PDI) of 1.6.

Example 5

Preparation of Photoresist Composition (Polyimide Composition)

0.5 g of a diazonaphthoquinone ester compound (TPPA 320, OH and OD are selectively determined depending on the ratio OD/(OD+OH)=2/3) as a photoactive compound and 4 g of γ-butyrolactone (GBL) as a solvent were added to 1.6 g of the soluble polyimide prepared in Example 1. The mixture was stirred at room temperature for 1 hr. The reaction mixture was filtered through a filter (pore size=1 μm) to prepare a photosensitive composition.

Example 6

Preparation of Photoresist Composition (Polyimide/Polyamic Acid Blend)

8.2 g of the soluble polyimide prepared in Example 1 and 27.5 g of the polyamic acid prepared in Example 4 were mixed together. To the mixture were added 4.7 g of a diazonaphthoquinone ester compound (TPPA 320, OH and OD are selectively determined depending on the ratio OD/(OD+OH)=2/3) as a photoactive compound and 18 g of γ-butyrolactone (GBL) as a solvent. The mixture was stirred at room temperature for 1 hr. The reaction mixture was filtered through a filter (pore size=1 μm) to prepare a photosensitive composition.

Comparative Example 1

Preparation of Polyimide Copolymer Using THNDA 11.0 g of 2,2-bis(3-amino-4-hydroxyphenyl)hexafluoropropane and 40 g of γ-butyrolactone were sequentially placed in a 100 mL round-bottom flask. The mixture was completely dissolved with slow stirring. 9.0 g of 4-(2,5-(dioxotetrahydrofuran-3-yl)-1,2,3,4-tetrahydronaphthalene-1,2-dicarboxylic anhydride (THNDA) was slowly added to the flask in a water bath while maintaining the flask at room temperature. The resulting mixture was stirred at room temperature for 16 hr, and then 7 g of toluene was added thereto. After a Dean-Stark distillation trap was installed in the flask, the mixture was heated to reflux at 140° C. for 3 hr in to remove water. The solution was cooled to room temperature and was slowly poured into a methanol/water (1/4) solution. The obtained solid was dried in a vacuum drying oven at 40° C. for one day, yielding 16 g of a soluble polyimide resin.

IR peaks corresponding to the polyimide were observed. The polyimide resin was found to have a weight average molecular weight of 40,000, as measured by GPC, and a polydispersity index (PDI) of 1.5.

Comparative Example 2

Preparation of Photoresist Composition (THNDA Polyimide Composition)

0.5 g of a diazonaphthoquinone ester compound (TPPA 320, OH and OD are selectively determined depending on the ratio OD/(OD+OH)=2/3) as a photoactive compound and 4 g of γ-butyrolactone (GBL) as a solvent were added to 1.6 g of the soluble polyimide prepared in Comparative Example 1. The mixture was stirred at room temperature for 1 hr. The reaction mixture was filtered through a filter (pore size=1 μm) to prepare a photosensitive composition.

Experimental Example 1

1. Evaluation of Physical Properties of Films

Each of the photosensitive compositions of Examples 4-6 was spin-coated on a glass plate and baked on a hot plate under a stream of nitrogen gas at 180° C. for 60 min and at 300° C. for 60 min to form a 10 μm thick polyimide film. Pressure cooking treatment (PCT) was conducted on the polyimide film in an autoclave under 2.3 atm at 125° C. for 30 min to peel the film from the glass plate. The polyimide film was cut into a test piece having a width of 1 cm and a length of 8 cm. The test piece was measured for tensile properties. The results are shown in Table 1.

TABLE 1

|  | Tensile Strength (MPa) | Elongation (%) | Modulus (GPa) |
| --- | --- | --- | --- |
| Example 4 | 160.4 | 126.5 | 2.9 |
| Example 5 | 108 | 10.7 | 3.2 |
| Example 6 | 127.6 | 32.8 | 3.0 |

Figure 2:
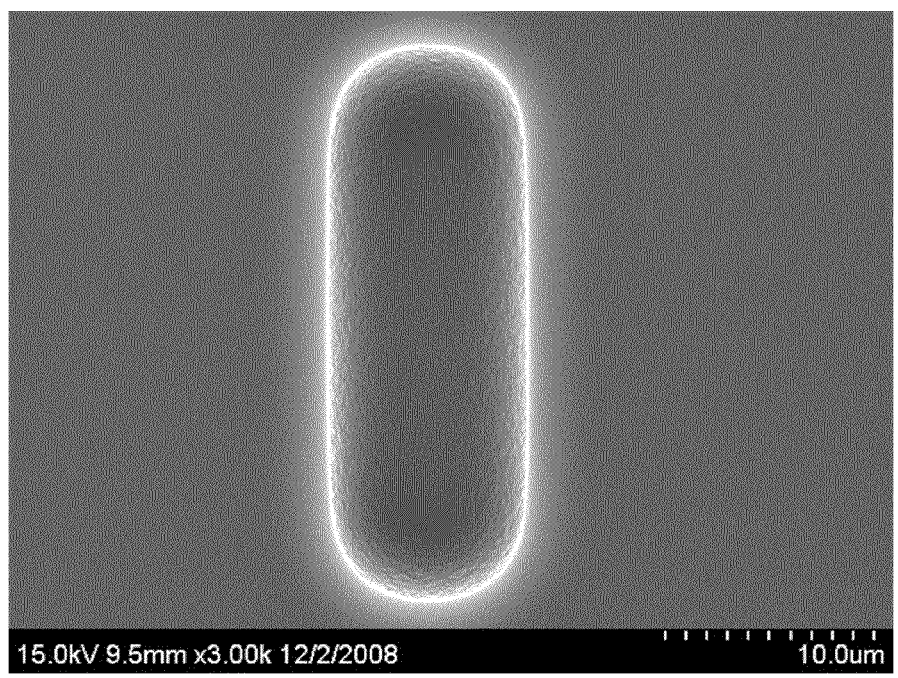

As can be seen from the results in Table 1 and FIGS. 1 and 2, the photoresist composition of Example 5 using the polyimide as a binder resin had high resolution (FIG. 1) and showed excellent mechanical properties, including tensile strength. In addition, the use of the blend of the polyimide and the polyamic acid as a binder resin in the photoresist composition of Example 6 suggests the possibility of better mechanical properties of the pattern.

2. Resolution and Sensitivity Evaluation

Each of the photosensitive composition prepared in Examples 5 and 6 and Comparative Example 2 was spin-coated on a 4" silicon wafer and prebaked on a hot plate at 120° C. for 2 min to form a 150 μm thick photosensitive film. The prebaked silicon wafer was adhered to a photomask under vacuum and exposed using an 1-line stepper while increasing the exposure energy from 100 mJ/cm$^2$ to 600 mJ/cm$^2$ at a rate of 5 mJ/cm$^2$. The exposed silicon wafer was developed with an aqueous 2.38 wt % tetramethylammonium hydroxide solution at 23° C. for 80 sec, washed with deionized water for 60 sec, and dried to form a pattern in which the unexposed portion was left unremoved. The patterned silicon wafer was baked on a hot plate under a stream of nitrogen gas. Specifically, the patterned silicon wafer was slowly heated from room temperature to 180° C. for about 30 min, maintained at 180° C. for 60 min, slowly heated to 300° C. for 30 min, and maintained at 300° C. for 60 min.

The baked film had a thickness of 10 μm. The pattern had a minimum linewidth of 3 μm, indicating high resolution of the photosensitive composition. FIGS. 1 and 2 are electron microscopy images of the high-resolution patterns formed using the photoresist compositions of Examples 5 and 6, respectively.

The pattern formed using the photoresist composition of Example 5 had a sensitivity of 450 mJ/cm$^2$ and a residual film ratio after development of 90%. In contrast, the pattern formed using the photoresist composition of Comparative Example 2, which was prepared using the polyimide copolymer of THNDA as a monomer, had a sensitivity of 550 mJ/cm$^2$ and a residual film ratio after development of 82%. If the photoresist composition of Example 5 is adjusted taking the residual film ratios of the photoresist compositions of Example 5 and Comparative Example 2 into consideration (i.e. assuming that the photoresist composition of Example 5 had the same residual film ratio after development as the photoresist composition of Comparative Example 2), it is anticipated that the photoresist composition of Example 5 will show a higher sensitivity level than the photoresist composition of Comparative Example 2. The higher photosensitivity of the photoresist composition of Example 5 is attributed to the higher transmittance (95%) of the polyimide copolymer using DTBDA than the transmittance (87%) of the polyimide copolymer using THNDA, indicating higher light efficiency of the photoresist composition of Example 5. This difference is due to the presence of the bulky t-butyl groups impeding the stack of the polymer chains and preventing the occurrence of charge transfer. In addition, the hydrophobicity of the t-butyl groups allows the photoresist composition of Example 5 to remain unremoved after development, which is responsible for the higher residual film ratio of the photoresist composition of Example 5 than the residual film ratio of the photoresist composition of Comparative Example 2 using THNDA, ensuring room for further improvement in sensitivity.

As is apparent from the foregoing, the photoresist composition of the present invention exhibits high resolution, high sensitivity, excellent film characteristics and improved mechanical properties, which are required for the formation of semiconductor buffer coatings.

What is claimed is:

1. A photosensitive polyimide-based polymer comprising at least one compound selected from the group consisting of compounds represented by Formulas 1 to 3:

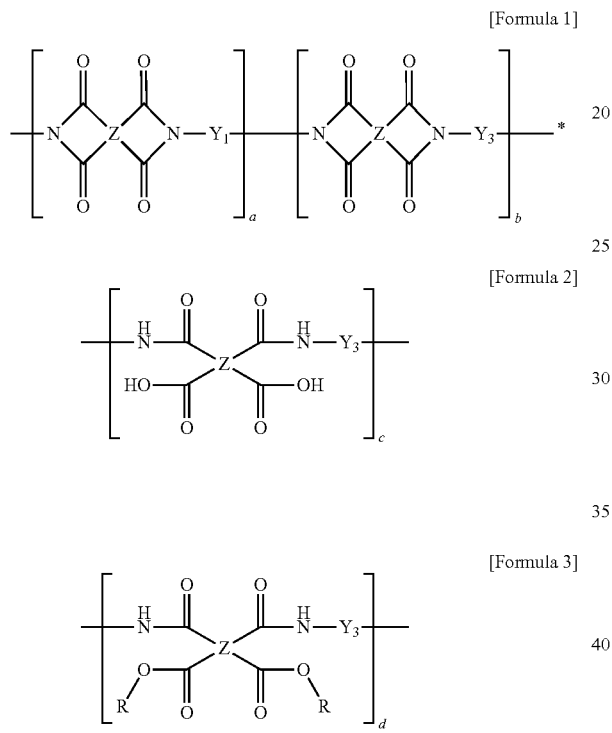

wherein each Z is a tetravalent organic group derived from one or more tetracarboxylic acids, including 3,4-dicarboxy-1,2,3,4-tetrahydro-6-tert-butyl-1-naphthalene succinic dianhydride (DTBDA), or derivatives thereof, a is from 1 to 150; b is from 1 to 400; $Y_1$ is a divalent organic group derived from a diamine and is selected from

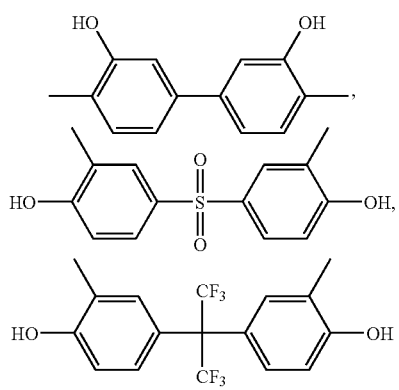

and

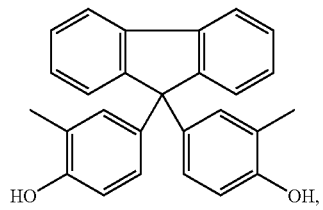

wherein $Y_2$ is a divalent aliphatic group or aromatic organic group derived from a diamine and is selected from the group consisting of aromatic diamines, such as p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane; aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diaminobenzanilide, 2,2-bis-[4-(4-aminophenoxy)phenyl]hexafluoropropane, 1,3-bis(3-aminopropyl)tetramethyldisiloxane, bis(p-aminophenoxy)dimethylsilane, diaminohexane, diaminododecane, 1,3-bis(4-aminophenoxy)benzene, 2,2-bis[4-(4-aminophenoxy)phenyl]propane, 1,1-bis(4-aminophenoxyphenyl)cyclohexane, bis[4-(4-aminophenoxy)phenyl]sulfone, 1,3-bis(3-aminophenoxy)benzene, 5-amino-1,3,3-trimethylcyclohexanemethylamine, 4,4'-bis(4-aminophenoxy)biphenyl, 1,1-bis(4-aminophenyl)cyclohexane, α,α'-bis(4-aminophenyl)-1,4-diisopropylbenzene, 1,3-bis(4-aminophenoxy)-2,2-dimethylpropane, 1,3-bis(4-aminophenoxy)benzene, 9,9-bis(4-aminophenyl)fluorine, and 4,4'-diamino-3,3'-dimethyldicyclohexylmethane; and mixtures thereof, wherein $Y_3$ is selected from the group consisting of $Y_1$ and $Y_2$, R is selected from the group consisting of alkyl and silyl alkyl groups, c is from 5 to 200, and d is from 5 to 200.

2. The photosensitive polyimide-based polymer according to claim 1, wherein each Z is a tetravalent organic group derived from one or more tetracarboxylic acids, including 1 to 100 mole % of 3,4-dicarboxy-1,2,3,4-tetrahydro-6-tert-butyl-1-naphthalene succinic dianhydride (DTBDA), or derivatives thereof.

3. The photosensitive polyimide-based polymer according to claim 1, wherein the polymer of Formula 1 has a weight average molecular weight of 1,000 to 100,000.

4. The photosensitive polyimide-based polymer according to claim 1, wherein the polymer of Formula 1 has a glass transition temperature of 200 to 400° C.

5. The photosensitive polyimide-based polymer according to claim 1, wherein each of the polymer of Formula 2 and Formula 3 has a weight average molecular weight of 1,000 to 200,000.

6. The photosensitive polyimide-based polymer according to claim 1, wherein each of the polymer of Formula 2 and Formula 3 has a glass transition temperature of 100 to 300° C.

7. A photosensitive polyimide-based polymer selected from a compound represented by Formulas 4 to 6:

[Formula 4]

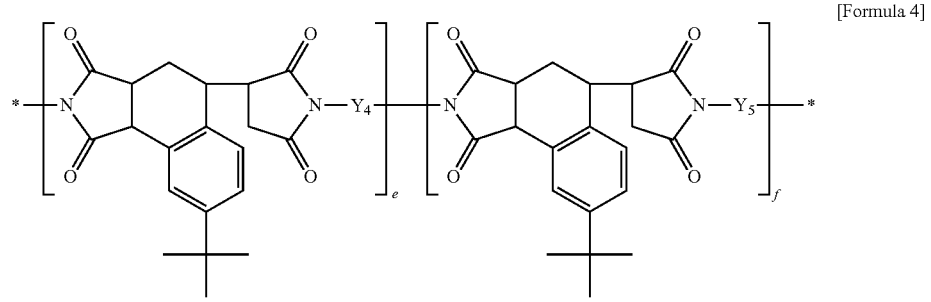

[Formula 5]

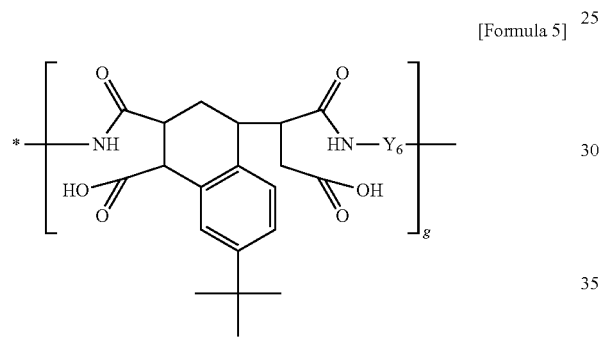

[Formula 6]

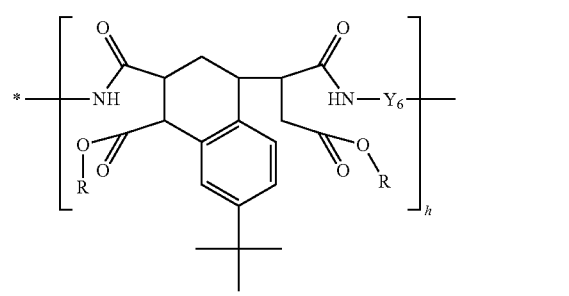

wherein $Y_4$ is a divalent organic group derived from a diamine and is selected from

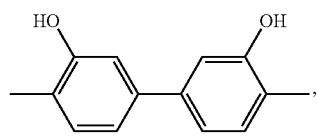

-continued

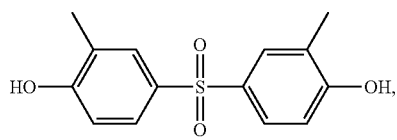

-continued

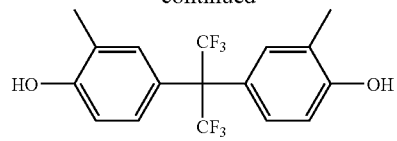

and

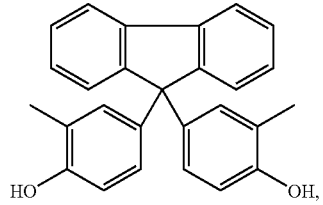

wherein $Y_5$ is a divalent aliphatic group or aromatic organic group derived from a diamine and is selected from the group consisting of aromatic diamines, such as p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane; aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, 4,4'-diaminobenzanilide, 2,2-bis-[4-(4-aminophenoxy)phenyl]hexafluoropropane, 1,3-bis(3-aminopropyl)tetramethyldisiloxane, bis(p-aminophenoxy)dimethylsilane, diaminohexane, diaminododecane, 1,3-bis(4-aminophenoxy)benzene, 2,2-bis[4-(4-aminophenoxy)phenyl]propane, 1,1-bis(4-aminophenoxyphenyl)cyclohexane, bis[4-(4-aminophenoxy)phenyl]sulfone, 1,3-bis(3-aminophenoxy)benzene, 5-amino-1,3,3-trimethylcyclohexanemethylamine, 4,4'-bis(4-aminophenoxy)biphenyl, 1,1-bis(4-aminophenyl)cyclohexane, α,α'-bis(4-aminophenyl)-1,4-diisopropylbenzene, 1,3-bis(4-aminophenoxy)-2,2-dimethylpropane, 1,3-bis(4-aminophenoxy)benzene, 9,9-bis(4-aminophenyl)fluorine, and 4,4'-diamino-3,3'-dimethyldicyclohexylmethane; and mixtures thereof, e is from 1 to 150; f is from 1 to 400; g defined in the formula 5 is from 5 to 200; R is selected from the group consisting of alkyl and silyl alkyl groups; and h defined in the formula 6 is from 5 to 200.

8. A copolymer mixture comprising the polyimide-based polymer for a photosensitive polyimide resin composition according to claim 1.

9. A positive type photoresist resin composition, comprising a binder resin, a photoactive compound, and a solvent, wherein said binder resin is characterized by at least one polyimide-based polymer selected from the group consisting of a compound represented by Formula 1, a compound represented by Formula 2, and a compound represented by Formula 3,
wherein
Formula 1 is

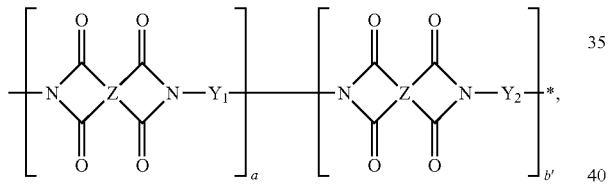

wherein each Z is a tetravalent organic group derived from one or more tetracarboxylic acids, including 3,4-dicarboxy-1,2,3,4-tetrahydro-6-tert-butyl-1-naphthalene succinic dianhydride (DTBDA), or derivatives thereof a is from 1 to 150, b is from 1 to 400, $Y_1$ is a divalent organic grpup derived from a diamine and is selected from

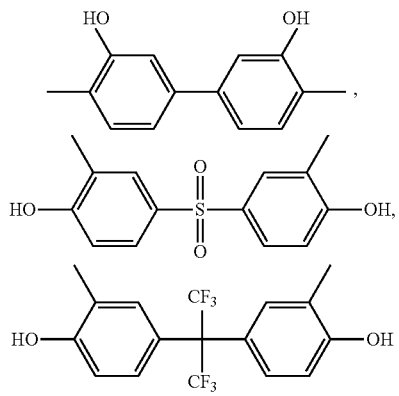

and

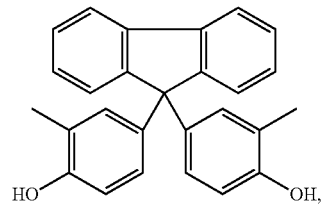

and $Y_2$ is a divalent aliphatic group or aromatic organic group derived from a diamine;
Formula 2 is

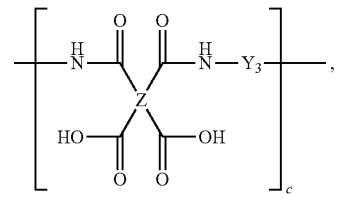

wherein Z is as defined in Formula 1, $Y_3$ is selected from $Y_1$ and $Y_2$ defined in the formula 1 and combinations thereof, and c is from 5 to 200; and
Formula 3 is

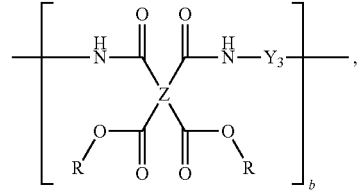

wherein Z is as defined in Formula 1, $Y_3$ is as defined in the Formula 2 and d is from 5 to 200.

10. The positive type photoresist resin composition according to claim 9, wherein the binder resin includes a polyamic acid of Formula 7:

[Formula 7]

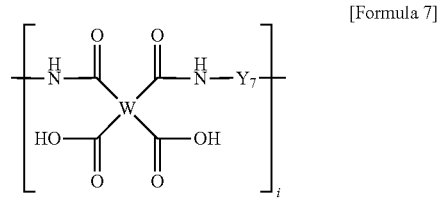

wherein W is a tetravalent organic group derived from a tetracarboxylic acid or a derivative thereof and contains at least one selected from the group consisting of

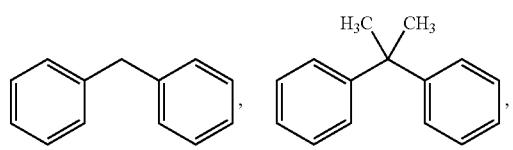

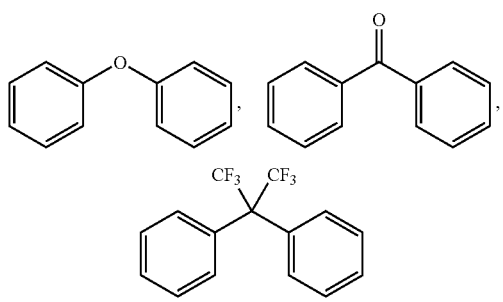

and

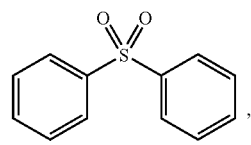

$Y_7$ is a divalent organic group derived from a diamine, wherein $Y_7$ is a divalent organic group derived from a diamine and is selected from aromatic diamines, such as p-phenylenediamine, m-phenylenediamine, 2,4,6-trimethyl-1,3-phenylenediamine, 2,3,5,6-tetramethyl-1,4-phenylenediamine, 4,4'-diaminodiphenyl ether, 3,4'-diaminodiphenyl ether, 3,3'-diaminodiphenyl ether, 4,4'-diaminodiphenyl sulfide, 4,4'-diaminodiphenylmethane, 3,4'-diaminodiphenylmethane, 3,3'-diaminodiphenylmethane, 4,4'-methylene-bis(2-methylaniline), 4,4'-methylene-bis(2,6-dimethylaniline), 4,4'-methylene-bis(2,6-diethylaniline), 4,4'-methylene-bis(2-isopropyl-6-methylaniline), 4,4'-methylene-bis(2,6-diisopropylaniline), 4,4'-diaminodiphenylsulfone, 3,3'-diaminodiphenylsulfone, benzidine, o-tolidine, m-tolidine, 3,3',5,5'-tetramethylbenzidine, 2,2'-bis(trifluoromethyl)benzidine, 1,4-bis(4-aminophenoxy)benzene, 1,3-bis(4-aminophenoxy)benzene, 1,3-bis(3-aminophenoxy)benzene, bis[4-(4-aminophenoxy)phenyl]sulfone, bis[4-(3-aminophenoxy)phenyl]sulfone, 2,2-bis[4-(4-aminophenoxy)phenyl]propane, and 2,2-bis[4-(3-aminophenoxy)phenyl]propane; aliphatic diamines, such as 1,6-hexanediamine, 1,4-cyclohexanediamine, 1,3-cyclohexanediamine, 1,4-bis(aminomethyl)cyclohexane, 1,3-bis(aminomethyl)cyclohexane, 4,4'-diaminodicyclohexylmethane, and 4,4'-diaminobenzanilide; and mixtures thereof, and i is from 5 to 200.

11. The positive type photoresist resin composition according to claim 10, wherein W is a tetravalent organic group derived from a tetracarboxylic acid or a derivative thereof and contains 1 to 100 mole % of at least one moiety selected from the group consisting of

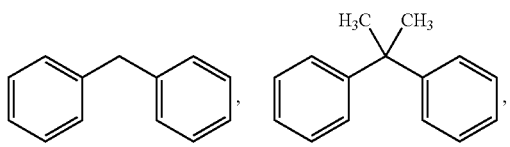

12. The positive type photoresist resin composition according to claim 10, wherein the binder resin includes 1 to 70 parts by weight of a polyamic acid of Formula 7.

13. The positive type photoresist resin composition according to claim 9, wherein the photoactive compound and the solvent are present in amounts of 1 to 50 parts by weight and 30 to 90 parts by weight, respectively, based on 100 parts by weight of the binder resin.

14. The positive type photoresist resin composition according to claim 9, wherein the binder resin has a transmittance rate for i-line of 50% or higher.

15. The positive type photoresist resin composition according to claim 10, wherein the polyamic acid compound of Formula 7 has an elongation of 40% or higher.

16. The positive type photoresist resin composition according to claim 9, wherein the photoactive compound is at least one compound selected from Formulas 8 to 11.

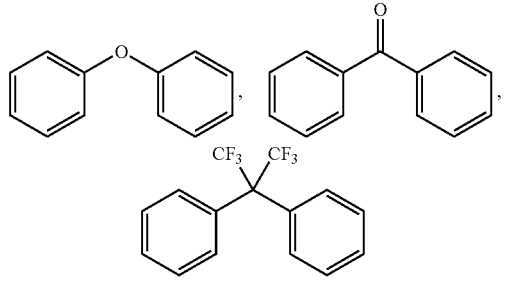

and

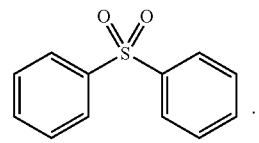

[Formula 8]

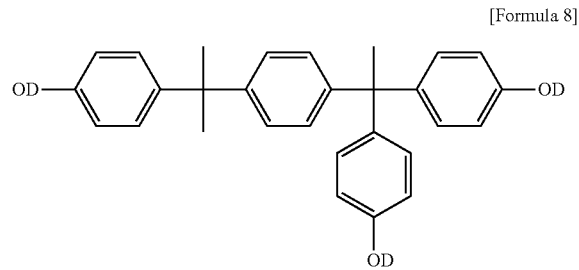

[Formula 9]

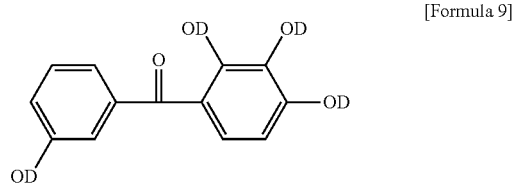

[Formula 10]

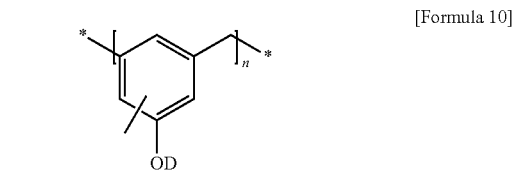

[Formula 11]

wherein OD is

17. The positive type photoresist resin composition according to claim 9, wherein the solvent is selected from the group consisting of N,N-dimethylformamide, N,N-dimethylacetamide, N-methylpyrrolidone, N-vinylpyrrolidone, N-methylcaprolactam, dimethylsulfoxide, tetramethylurea, pyridine, dimethylsulfone, hexamethylsulfoxide, m-cresol, γ-butyrolactone, ethyl cellosolve, butyl cellosolve, ethyl carbitol, butyl carbitol, ethyl carbitol acetate, butyl carbitol acetate, ethylene glycol, ethyl lactate, butyl lactate, cyclohexanone, cyclopentanone, and mixtures thereof.

* * * * *